United States Patent
Ko et al.

(10) Patent No.: US 7,923,777 B2
(45) Date of Patent: Apr. 12, 2011

(54) POWER SEMICONDUCTOR DEVICE AND METHOD FOR MANUFACTURING THE SAME

(75) Inventors: Choul Joo Ko, Seongnam-si (KR); Nam Joo Kim, Yongin-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/553,546

(22) Filed: Sep. 3, 2009

(65) Prior Publication Data

US 2010/0314675 A1      Dec. 16, 2010

Related U.S. Application Data

(62) Division of application No. 11/590,373, filed on Oct. 30, 2006, now Pat. No. 7,601,600.

(30) Foreign Application Priority Data

Oct. 28, 2005   (KR) .................. 10-2005-0102126

(51) Int. Cl.
*H01L 29/76* (2006.01)
(52) U.S. Cl. .............................. 257/336; 257/E29.133

(58) Field of Classification Search .................. 257/336, 257/492, 493, E29.261, E21.427; 438/306
See application file for complete search history.

(56) References Cited

U.S. PATENT DOCUMENTS

| | | | |
|---|---|---|---|
| 5,489,547 A | 2/1996 | Erdeljac et al. | |
| 5,939,753 A | 8/1999 | Ma et al. | |
| 6,156,602 A * | 12/2000 | Shao et al. | 438/238 |
| 6,933,560 B2 * | 8/2005 | Lee et al. | 257/328 |
| 2007/0069308 A1 | 3/2007 | Ko | |

* cited by examiner

*Primary Examiner* — Thomas L Dickey
*Assistant Examiner* — Fazli Erdem
(74) *Attorney, Agent, or Firm* — The Law Offices of Andrew D. Fortney; Andrew D. Fortney (57) ABSTRACT

Disclosed are a power semiconductor device and a method for manufacturing the same. The power semiconductor device has a PIP capacitor and an LDMOS transistor, the LDMOS transistor having second and third gate electrodes separate from a first gate electrode, which may be formed in the process of forming the upper electrode of the PIP capacitor, so it is possible to realize an LDMOS having a higher breakdown voltage and lower Ron and Rsp without additional processing. A drain voltage, which may be different from a voltage applied to the first gate electrode, may be applied to the third gate electrode, so it is possible to realize an LDMOS having a high breakdown voltage and low Ron and Rsp.

10 Claims, 7 Drawing Sheets

POWER SEMICONDUCTOR DEVICE AND METHOD FOR MANUFACTURING THE SAME

This application is a divisional of U.S. application Ser. No. 11/590,373, filed Oct. 30, 2006 now U.S. Pat. No. 7,601,600, which claims the benefit of the Korean Application No. 10-2005-0102126, filed on Oct. 28, 2005, each of which is incorporated herein by reference in its entirety.

BACKGROUND OF THE INVENTION

1. Field of the Invention

The present invention relates to a power semiconductor device. More specifically, the present invention relates to a power semiconductor device having a lateral diffused MOS (LDMOS), which may be characterized as a high-power MOS, and a poly-silicon/insulator/poly-silicon (PIP) capacitor, and a method for manufacturing the same.

2. Description of the Related Art

Ideally, it is preferred for a power semiconductor device to be able to operate at a high voltage, close to a theoretical breakdown voltage of a semiconductor device. Accordingly, when an external system using a high voltage is controlled by an integrated circuit (IC), the IC needs elements for controlling the high voltage, and such elements must have a high breakdown voltage.

For example, in a drain or a source of a transistor directly receiving a high voltage, a punch through voltage between the drain/source and a semiconductor substrate and a breakdown voltage between the drain/source and a well of the semiconductor substrate must be higher than the high voltage received at the drain/source.

From among high-power semiconductor devices, an LDMOS transistor, which may be characterized as a high-power MOS transistor, has a structure suitable for operation at a high voltage because a channel region and a drain electrode are separated from each other about a drift region such that a gate electrode can control the channel region and the drain electrode.

Meanwhile, many analog circuits (e.g., manufactured using CMOS logic processes and CMOS semiconductor devices) may employ PIP and/or MIM capacitors. Since such capacitors are independent from bias, and may operate differently from a MOS-type capacitor or a junction capacitor, the PIP and MIM capacitors benefit from precision. Among the capacitors, the PIP capacitor is widely used for noise prevention and frequency modulation. With the development of a high integration technology for making semiconductor devices, the PIP capacitor can be integrated together with an LDMOS transistor.

Hereinafter, a structure of a conventional power semiconductor device having a PIP capacitor and an LDMOS transistor will be described with reference to accompanying drawings.

Figure 1A:
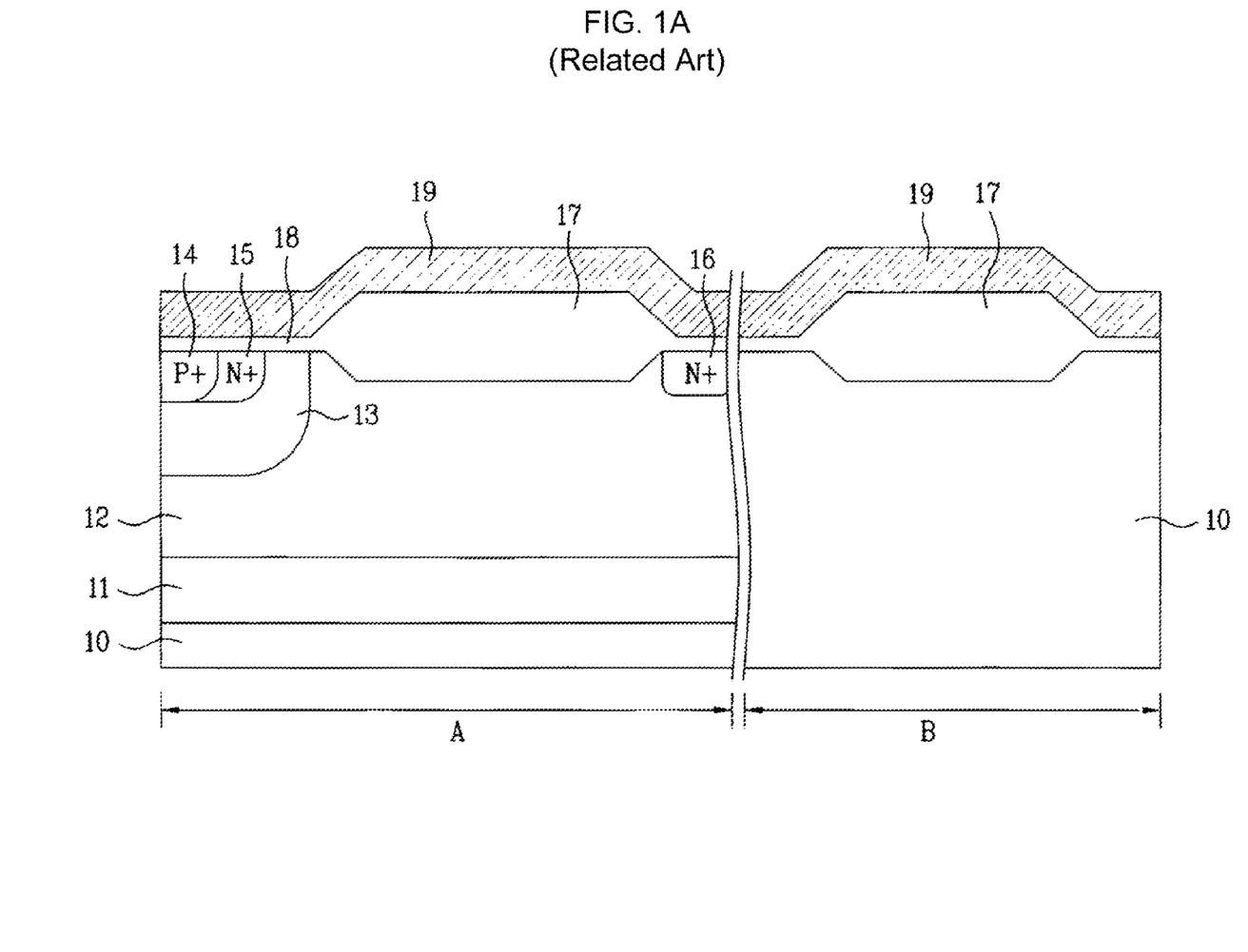
FIGS. 1A to 1C are sectional views showing a conventional method for manufacturing a power semiconductor device.
Figure 1B:
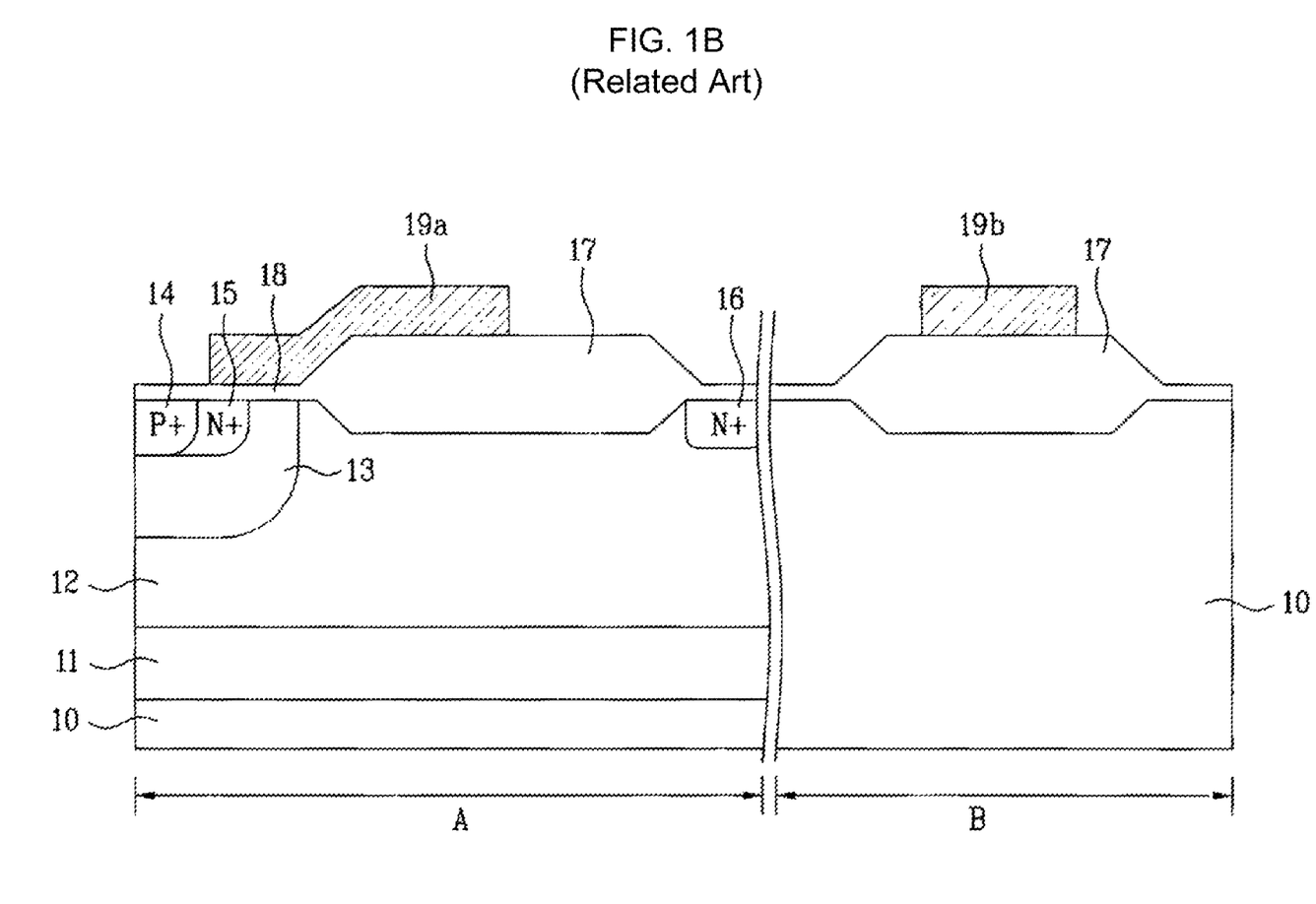
Figure 1C:
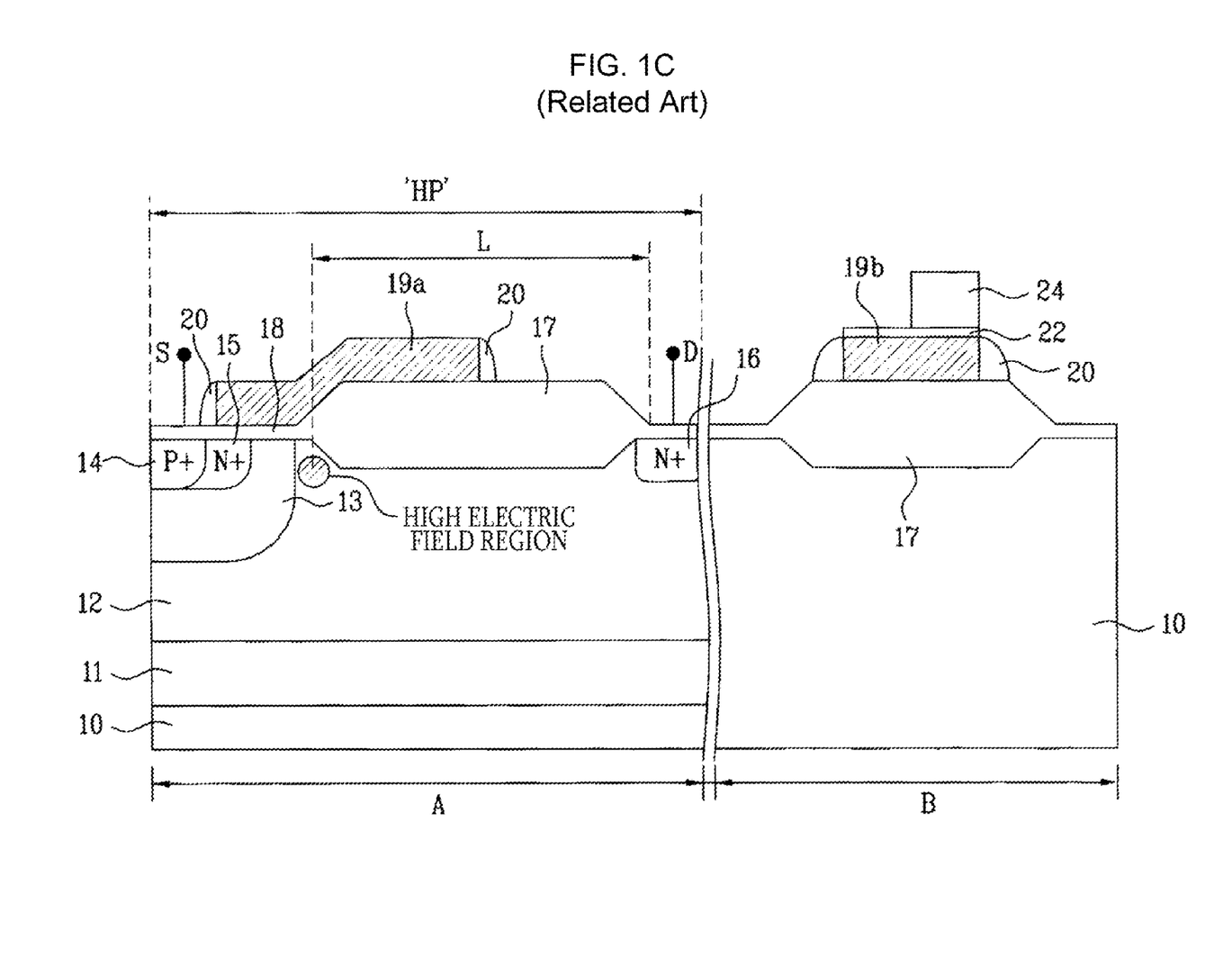

FIGS. 1A to 1C are sectional views showing a conventional method for manufacturing a power semiconductor device having a PIP capacitor and an LDMOS transistor.

Hereinafter, the conventional method for manufacturing the power semiconductor device having the PIP capacitor and the LDMOS transistor will be given.

As shown in FIG. 1A, a P type semiconductor substrate 10 includes an LDMOS transistor region A and a PIP capacitor region B.

In the semiconductor substrate 10 having the PIP capacitor region B and the LDMOS transistor region A, an N doped buried layer 11 is formed in the LDMOS transistor region A of the semiconductor substrate 10, a first P doped well 12 is formed in the buried layer 11, a field insulating layer 17 is formed on the surface of the first well 12 of the semiconductor substrate 10, a second P doped well 13 is formed in the first well 12 at one side of the field insulating layer 17, and a first P+ doping region 14 is formed on the surface of the second well 13. Thereafter, an N+ doped source region 15 is formed in a predetermined region of the first well 12 adjacent to the first doping region 14 and an N+ doped drain region 16 is formed in a predetermined region of the first well 12 spaced apart from the first doping region 14, respectively. The source region 15 and the drain region 16 are formed at both sides of the field insulating layer 17, respectively, while being separated from each other.

At this time, the field insulating layer 17 is also formed on the PIP capacitor region B during the process of forming the field insulating layer 17 on the LDMOS transistor region A.

A gate insulating layer 18 is formed on the entire surface of the substrate 10 when the field insulating layer 17 is formed, or shortly thereafter.

Then, a first poly-silicon layer 19 is deposited on the entire surface of the substrate 10 having the above structure.

Next, as shown in FIG. 1B, the first poly-silicon layer 19 is etched through a photolithography process, thereby forming a gate electrode 19a on the LDMOS transistor region A while forming a lower electrode 19B on the PIP capacitor region B.

Thereafter, as shown in FIG. 1C, after depositing an insulating layer on the entire surface of the substrate 10, an anisotropic etching process is performed, thereby forming sidewall spacers 20 at opposite sides of the gate electrode 19a and opposite sides of the lower electrode 19b.

Then, a dielectric layer and a second poly-silicon layer are deposited on the entire surface of the resultant structure, and then a capacitor dielectric layer 22 and an upper electrode 24 are formed only on the PIP capacitor region B through a photolithography process.

Meanwhile, in FIG. 1C, "L" of the transistor region represents the width of the field insulating layer 17, and "HP" (half pitch) represents a distance between the source region 15 and the drain region 16.

In addition, it is necessary for the gate electrode 19a to enhance a breakdown voltage by lowering a strong electric field at a gate edge and to lower Ron and Rsp of the LDMOS transistor by reducing resistance of the first well 12.

In order to enhance the breakdown voltage of the LDMOS transistor, there has been suggested a method for increasing the value of the "L". However, if the value of the "L" is increased, the value of the HP is also increased, so that the strength of the electric field may increase at the gate edge. Thus, the probability of the breakdown on the surface of the substrate may rise, and the Ron and Rsp may increase.

SUMMARY OF THE INVENTION

It is, therefore, an object of the present invention to provide a power semiconductor device and a method for manufacturing the same, capable of improving Ron and Rsp while enhancing (e.g., improving or increasing) a breakdown voltage.

According to a preferred embodiment of the present invention, there is provided a power semiconductor device that comprises an LDMOS transistor on a semiconductor substrate, the LDMOS transistor including a first field insulating layer in a first predetermined region of the semiconductor substrate, a source region at a first side of the first field insulating layer, a drain region at a second (or opposite) side of the first field insulating layer, a first gate electrode on the first field insulating layer between the source region and the drain region, a second gate electrode separate from the first gate electrode on the first field insulating layer, and a third gate electrode on an upper part of the second gate electrode and insulated from the second gate electrode by a first dielectric layer, and a PIP capacitor including a second field insulating layer on a second predetermined region of the semiconductor substrate, a lower electrode on the second field insulating layer, a second dielectric layer on the lower electrode, and an upper electrode on the second dielectric layer. In one embodiment, the LDMOS transistor is configured such that a voltage applied to the drain region is also applied to the third gate electrode.

It is preferred that the semiconductor substrate includes a first conductive type semiconductor substrate.

It is preferred that the first conductive type semiconductor substrate includes a buried layer having a second conductive type, a first well in the buried layer having a first conductive type, a second well in the first well at one side of the first field insulating layer and having a first conductive type, and a first doping region in the second well adjacent to the source region and having a first conductive type.

It is also preferred that the LDMOS transistor further comprise sidewall spacers at sidewalls of the first, second, and third gate electrodes.

It is also preferred that the LDMOS transistor further comprise a gate insulating layer on an entire surface of the semiconductor substrate except for the first field insulating layer or the second field insulating layer.

It is preferred that the first and second conductive types represent a P type and an N type, respectively.

According to another aspect of the present invention, there is provided a method for manufacturing a power semiconductor device, the method comprising the steps of patterning a poly-silicon layer on first and second field insulating layers separate from each other on a semiconductor substrate, thereby forming a lower electrode on the second field insulating layer in a PIP capacitor region and first and second gate electrodes on the first field insulating layer in an LDMOS transistor region, and patterning a dielectric layer and a second poly-silicon layer on the resultant structure, thereby forming a second dielectric layer and an upper electrode in the PIP capacitor region and a first dielectric layer and a third gate electrode at least partially on the second gate electrode of the LDMOS transistor region. The method may further comprise forming a source region at a first side of the first field insulating layer, and a drain region at a second side of the first field insulating layer.

It is preferred that the method further comprises a step of forming sidewall spacers at sidewalls of the first, second, and third gate electrodes.

It is also preferred that the semiconductor substrate includes a first conductive type semiconductor substrate.

It is also preferred that the method further comprises the steps of forming a buried layer having a second conductive type, and forming a first well having the first conductive type in the buried layer, on or in the first conductive type semiconductor substrate before forming the first field insulating layer.

It is also preferred that the method further comprises the steps of forming a second well having the first conductive type in the first well at the first side of the first field insulating layer, and forming a first doping region having the first conductive type adjacent to the source region on a surface of the second well, after forming the first field insulating layer.

It is also preferred that the first and second conductive types are a P type and an N type, respectively.

It is also preferred that the method further comprises a step of forming a gate insulating layer on an entire surface of the semiconductor substrate except for the first field insulating layer or the second field insulating layer.

DETAILED DESCRIPTION OF THE INVENTION

Hereinafter, a preferred embodiment according to the present invention will be described in detail, with reference to the following drawings. In the following description of the present invention, technologies which are generally known in the art and do not directly relate to the present invention will be omitted in order to avoid redundancy and to clarify the subject matter of the present invention. In the same manner, some of elements are exaggerated, omitted or simplified in the drawings and the elements may have sizes and/or shapes different from those shown in drawings, in practice. Particularly, in the drawings, the thickness of layer regions is exaggerated for the purpose of clarity. In addition, when a layer is expressed as it is formed on another layer or a substrate, the layer may be directly formed on another layer or the substrate, or a third layer may be interposed therebetween. The same reference numerals represent the same components throughout the specification.

Figure 2:
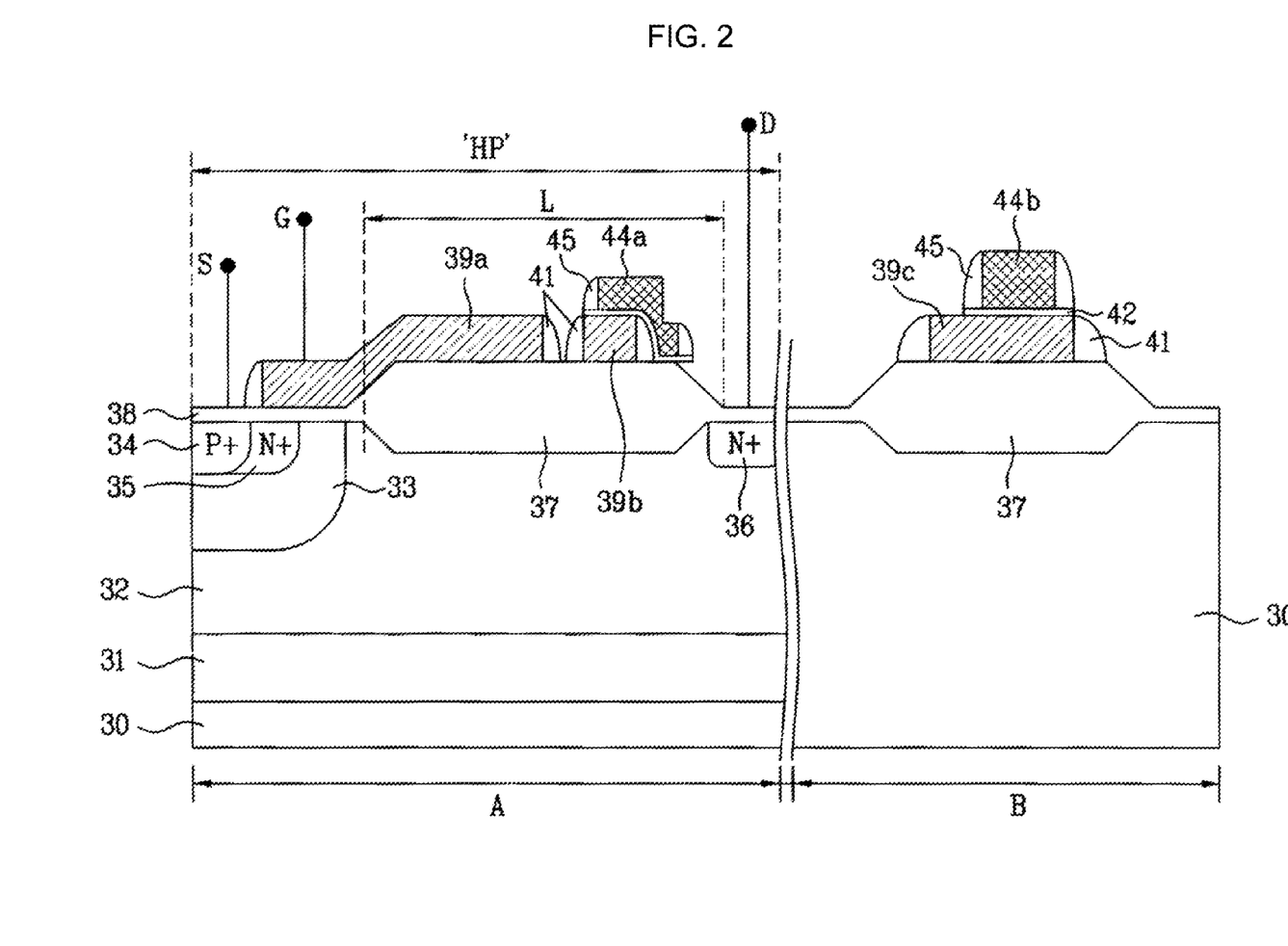
FIG. 2 is a sectional view showing a structure of a power semiconductor device according to an embodiment of the present invention.
Figure 3A:
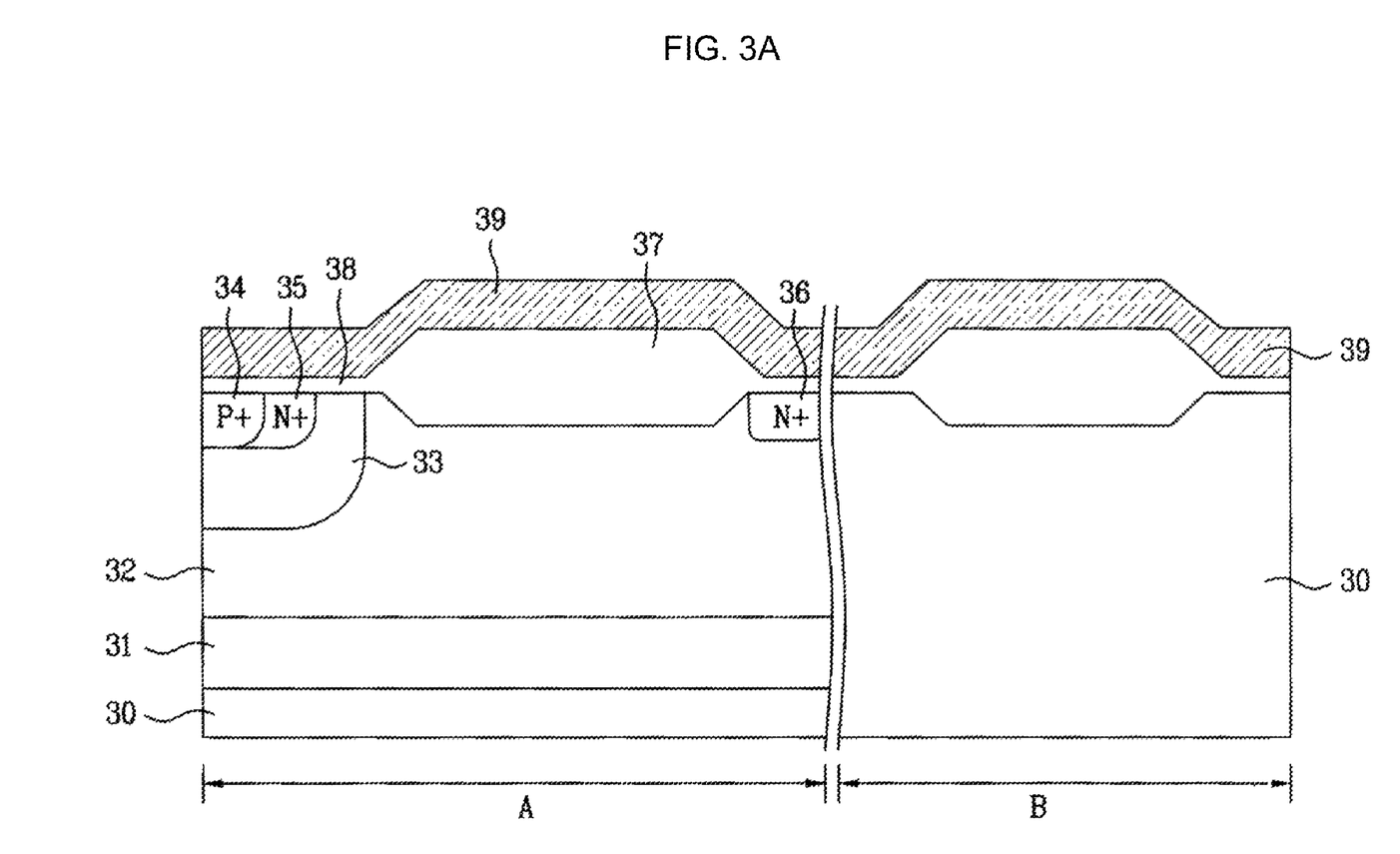
FIGS. 3A to 3C are sectional views showing a method for manufacturing a power semiconductor device according to an embodiment of the present invention.
Figure 3B:
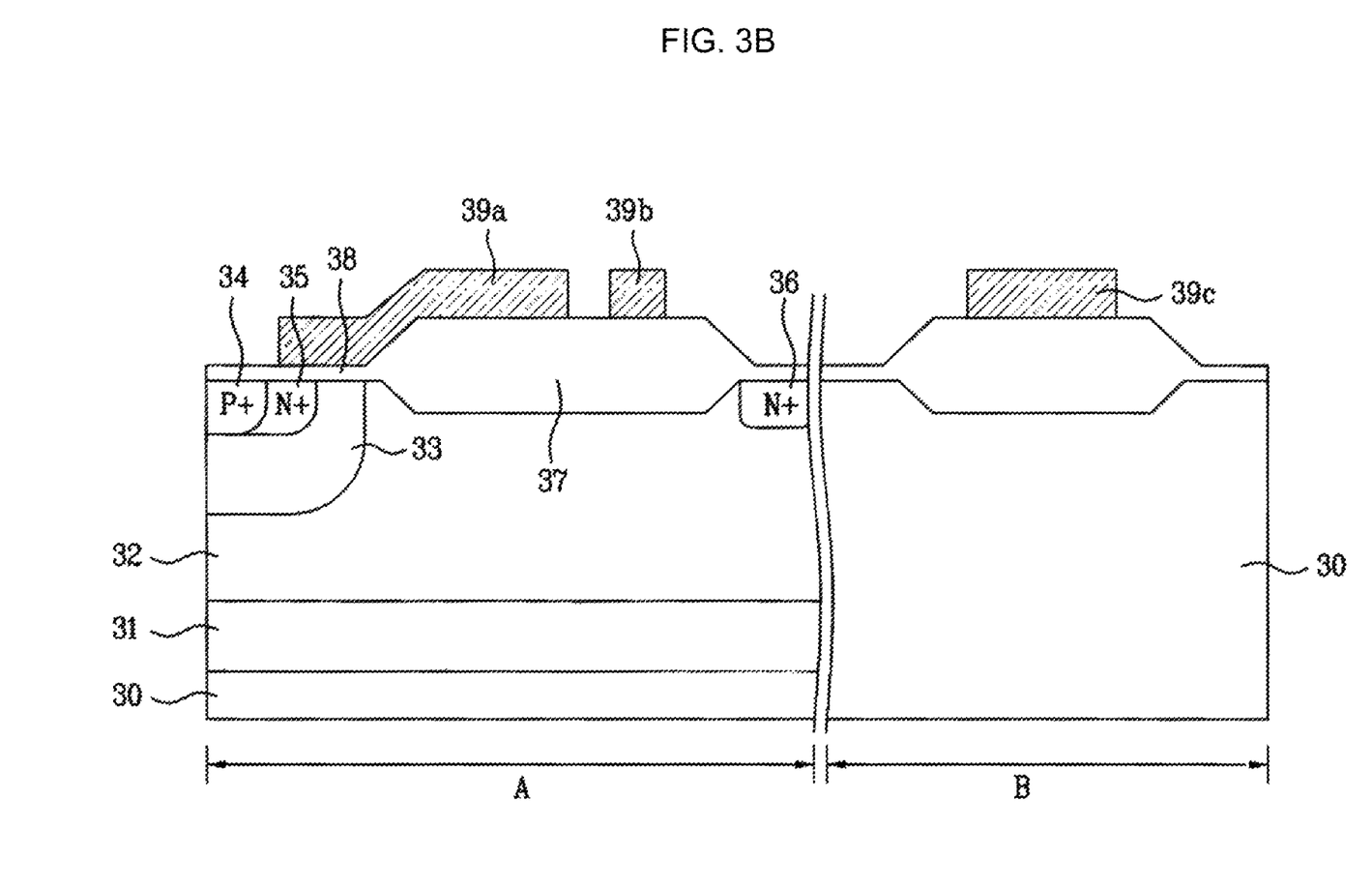
Figure 3C:
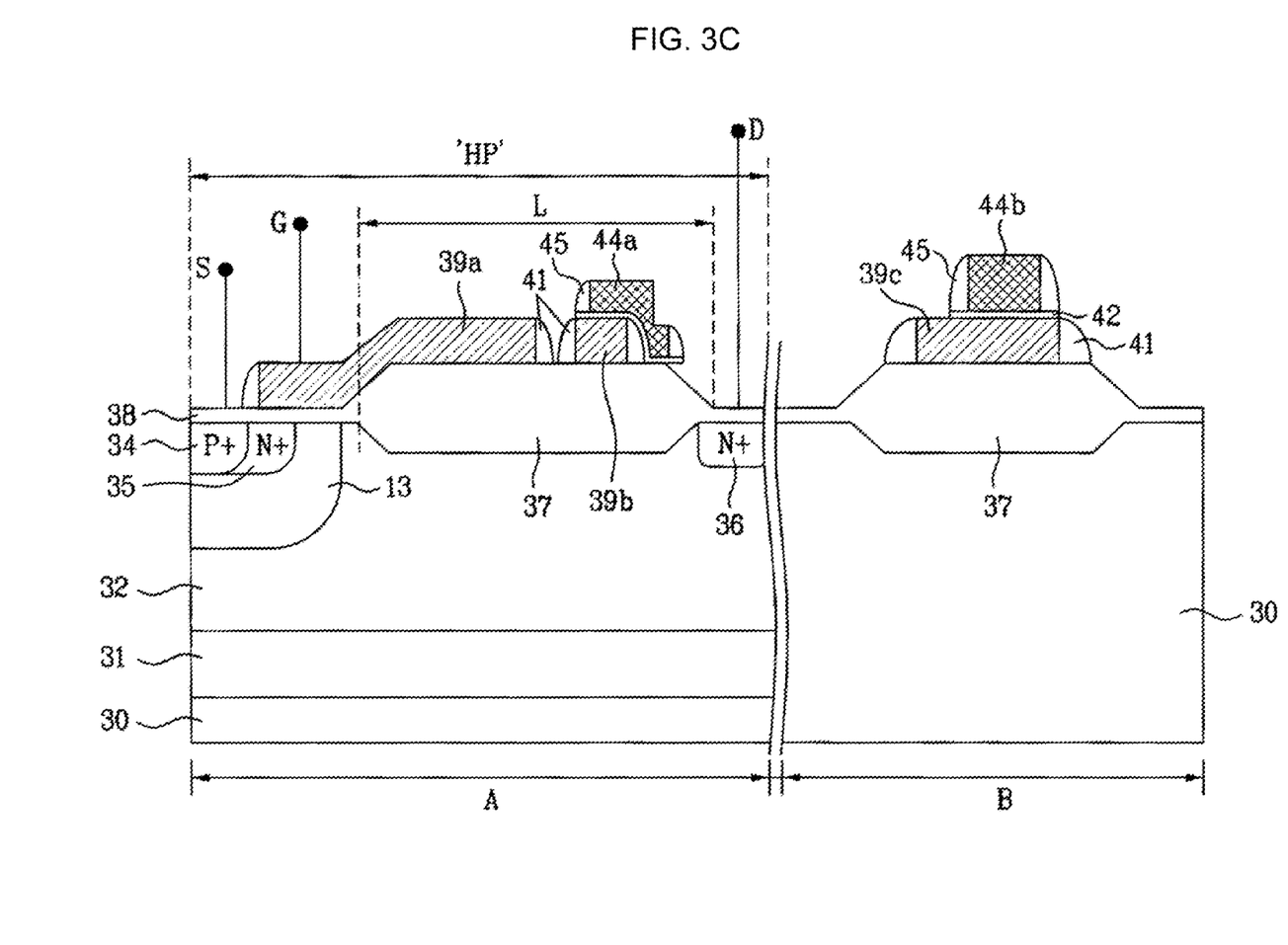

FIG. 2 is a sectional view showing a structure of a power semiconductor device having a poly-silicon/insulator/poly-silicon (PIP) capacitor and a lateral diffused MOS (LDMOS) transistor according to an embodiment of the present invention, and FIGS. 3A to 3C are sectional views showing a method for manufacturing the power semiconductor device having the PIP capacitor and the LDMOS transistor according to an embodiment of the present invention.

Hereinafter, description about the power semiconductor device will be given by defining a P type power semiconductor device as a first conductive type power semiconductor device and an N type power semiconductor device as a second conductive type power semiconductor device.

The power semiconductor device according to an embodiment of the present invention has the PIP capacitor and the LDMOS transistor. First, description about the structure of the LDMOS transistor will be made below.

As shown in FIG. 2, the LDMOS transistor includes a buried layer 31 doped with a second conductive type (e.g., N type) material and formed in a first conductive type (e.g., P type) substrate 30, a first well 32 doped with the first conductive type (e.g., P type) material and formed in the buried layer 31, a field insulating layer 37 formed on a surface of the first well 32 of the substrate 30, a second well 33 doped with the first conductive type (e.g., P type) and formed in the first well 32 at one side of the field insulating layer 37, and a first doping region 34 doped with a high-density first conductive type (e.g., P+) material and formed on the surface of the second well 33. Thereafter, a source region 35 doped with a high-density second conductive type (e.g., N+) material is formed on a predetermined region of the second well 33 adjacent to the first doping region 34, and a drain region 36 is formed on a predetermined region of the first well 32 at the other (e.g., opposite) side of the field insulating layer 37 separated from the source region 35. As described above, the source region 35 and the drain region 36 are formed at opposite sides of the field insulating layer 37, respectively, while being separated from each other. A gate insulating layer 38 is formed on the entire surface of the substrate 30 except for the field insulating layer(s) 37.

First and second gate electrodes 39a and 39b are formed on the field insulating layer 37 between the source region 35 and the drain region 36 separate from each other, and a third gate electrode 44a is formed on the gate electrode 39b separate from the second gate electrode 39b by a first dielectric layer 42.

At this time, the third gate electrode 44a may be electrically connected with the drain region 36 so that the same voltage is applied to the third gate electrode 44a and the drain region 36. In other words, a bias voltage applied to the third gate electrode 44a may differ from that applied to the first gate electrode 39a.

Then, sidewall spacers 41 and 45 are formed at sides of the first, second, and third gate electrodes 39a, 39b, and 44a.

Hereinafter, description will be given about the structure of the PIP capacitor of the power semiconductor device according to an embodiment of the present invention.

As shown in FIG. 2, the PIP capacitor includes the field insulating layer 37 formed on the surface of the substrate 30, in which a lower electrode 39c, a capacitor dielectric layer 42, and an upper electrode 44b are sequentially stacked on the field insulating layer 37.

In addition, the sidewall spacers 41 and 45 are formed at both sides of the lower and upper electrodes 39c and 44b, respectively.

Hereinafter, a method for manufacturing the power semiconductor device including the PIP capacitor and the LDMOS transistor having the above structures will be described.

As shown in FIG. 3A, the first conductive type (P type) semiconductor substrate 30 includes the LDMOS transistor region A and the PIP capacitor region B.

In the semiconductor substrate 30 having the above regions, the buried layer 31, which is doped with the second conductive type (e.g., N type) material, is formed in the first conductive type (e.g., P type) substrate 30 of the LDMOS transistor region A, the first well 32, which is doped with the first conductive type (e.g., P type) material, is formed in the buried layer 31, and the field insulating layer 37 is formed on the surface of the first well 32 of the substrate 30. Subsequently, the second well 33, which is doped with the first conductive type (e.g., P type) material, is formed in the first well 32 at one side of the field insulating layer 37, and the first doping region 34, which is doped with the first conductive type (e.g., P+, at a relatively high dopant density) material at high density, is formed on the surface of the second well 33. Thereafter, the source region 35 and the drain region 36, which are doped with the second high-density conductive type (e.g., N+, at a relatively high dopant density) material, are formed in a predetermined region adjacent to the first doped area 34 and in a predetermined region of the first well 32 spaced apart from the first doped area 34, respectively. That is, the source region 35 and the drain region 36 are formed at both sides of the field insulating layer 37, respectively, while being separated from each other. Each of the wells and doped (or conductive type) areas may be formed by conventional ion implantation, in accordance with techniques known to those skilled in the art.

At this time, the field insulating layer 37 is formed in the PIP capacitor region B in the process of forming the field insulating layer 37 of the LDMOS transistor region. While the field insulating layers 37 are shown as LOCOS structures (e.g., formed by LOCal Oxidation of Silicon), field insulating layers 37 may also comprise conventional shallow trench isolation structures (e.g., formed by a conventional shallow trench isolation process).

Then, the gate insulating layer 38 is formed on the entire surface of the semiconductor substrate 30 in the process of forming the field insulating layer 37, or shortly thereafter (e.g., after removing a field oxide mask), for example by conventional wet or dry thermal oxidation.

The poly-silicon layer 39 is deposited on the entire surface of the semiconductor substrate 30 having the above structure.

Thereafter, after coating a photoresist film (not shown) on the upper part of the poly-silicon layer 39, the photoresist film (not shown) is selectively patterned through an exposure and development process such that the photoresist film has patterns spaced apart from each other at a predetermined interval. At this time, the photoresist film is patterned on the field insulating layer 37 between the source region 35 and the drain region 36 (i.e., in the LDMOS transistor region A).

Next, as shown in FIG. 3B, the poly-silicon layer 39 is etched using the patterned photoresist film (not shown) as a mask, thereby forming the lower electrode 39c in the PIP capacitor region B while forming the first and second electrodes 39a and 39b separate from each other in the LDMOS transistor region A.

Thereafter, as shown in FIG. 3C, after depositing a first insulating layer (e.g., comprising silicon dioxide) on the entire surface of the semiconductor substrate (e.g., by chemical vapor deposition from a silicon source such as silane or tetraethyl orthosilicate and an oxygen source such as dioxygen and/or ozone), an anisotropic etching process is performed with respect to the insulating layer, thereby forming the sidewall spacers 41 at both sides of the first and second gate electrodes 39a and 39b and the lower electrode 39c.

Subsequently, a dielectric layer (e.g., comprising silicon dioxide, as for the insulating layer) and the second poly-silicon layer are deposited on the entire surface of the resultant structure, and a first dielectric layer 42 and the third gate electrode 44a are formed in the LDMOS transistor region A while a second dielectric layer 42 and the upper electrode 44b are formed in the PIP capacitor region B through a photolithography and etching process.

Then, after depositing a second insulating layer on the entire surface of the resultant structure (which may comprise the same material and be formed in the same manner as the first insulating layer), an anisotropic etching process is performed, thereby forming sidewall spacers 45 at both sides of the third gate electrode 44a and the upper electrode 44b.

In FIG. 3C, the "L" of the transistor represents the width of the field insulating layer 37, and "HP" (half pitch) represents a distance between the source region 35 and the drain region 36.

As described above, according to the present invention, the single-layered gate electrode 39a and the dual-layered gate electrodes 39b and 44a are formed between the source region 35 and the drain region 36. In addition, since the drain 36 and the third gate electrode 44a, which is the upper gate electrode of the dual-layered gate electrodes 39b and 44a, may be configured or electrically connected to receive a common applied voltage, an electric field can be lowered at an edge part of the first gate electrode 39a, and a great amount of current may flow through the LDMOS transistor, so Ron and Rsp are lowered.

Accordingly, it is possible to realize an LDMOS having a breakdown voltage higher than that of a conventional LDMOS (which would otherwise increase the breakdown voltage by increasing the "L" representing the length of the field insulating layer 37).

Although the P type and the N type are described as the first conductive type and the second conductive in the above description, they can be replaced with the second conductive type and the first conductive type, respectively.

As described above, a power semiconductor device and a method for manufacturing the same according to the present invention have following advantages.

First, a third gate electrode is formed on the LDMOS transistor region in the process of forming the upper electrode of the PIP capacitor region, so it is possible to realize an LDMOS having a higher breakdown voltage and lower Ron and Rsp without an additional photolithography process (e.g., mask step).

Second, the third gate electrode is formed on the second gate electrode separate from the first gate electrode, and a drain voltage (which may be different from a voltage applied to the first gate electrode) can be applied to the third gate electrode, so it is possible to realize an LDMOS having a high breakdown voltage and low Ron and Rsp.

What is claimed is:

1. A power semiconductor device comprising:
an LDMOS transistor, a first field insulating layer in a first predetermined region of a semiconductor substrate, a source region at a first side of the first field insulating layer, a drain region at a second side of the first field insulating layer, a first gate electrode on the first field insulating layer between the source region and the drain region, a second gate electrode separate from the first gate electrode on the first field insulating layer, and a third gate electrode on an upper part of the second gate electrode and insulated from the second gate electrode by a first dielectric layer; and
a PIP capacitor including a second field insulating layer on a second predetermined region of the semiconductor substrate, a lower electrode on the second field insulating layer, a second dielectric layer on the lower electrode, and an upper electrode on the dielectric layer.

2. The power semiconductor device as claimed in claim 1, wherein the semiconductor substrate has a first conductive type.

3. The power semiconductor device as claimed in claim 2, wherein the first conductive type semiconductor substrate includes:
a buried layer having a second conductive type.

4. The power semiconductor device as claimed in claim 3, wherein the first conductive type semiconductor substrate further includes:
a first well in the buried layer having the first conductive type.

5. The power semiconductor device as claimed in claim 2, wherein the first conductive type semiconductor substrate includes:
a second well in the first well at one side of the first field insulating layer and having the first conductive type.

6. The power semiconductor device as claimed in claim 5, wherein the first conductive type semiconductor substrate includes:
a first doping region in the second well adjacent to the source region and having the first conductive type.

7. The power semiconductor device as claimed in claim 1, further comprising sidewall spacers at sidewalls of the first, second, and third gate electrodes.

8. The power semiconductor device as claimed in claim 1, further comprising a gate insulating layer on an entire surface of the semiconductor substrate except for the first field insulating layer and the second field insulating layer.

9. The power semiconductor device as claimed in claim 2, wherein the first conductive type is a P type and the second conductive type is an N type.

10. The power semiconductor device as claimed in claim 1, configured such that a voltage applied to the drain region is also applied to the third gate electrode.

* * * * *